United States Patent
Mou et al.

(10) Patent No.: US 9,263,134 B2
(45) Date of Patent: Feb. 16, 2016

(54) NON-VOLATILE MEMORY WHICH CAN INCREASE THE OPERATION WINDOW

(71) Applicant: UNITED MICROELECTRONICS CORP., Hsin-Chu (TW)

(72) Inventors: Ya-Nan Mou, Hsinchu (TW); Hsin-Pang Lu, Hsinchu County (TW); Hsi-Wen Chen, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 94 days.

(21) Appl. No.: 14/215,091

(22) Filed: Mar. 17, 2014

(65) Prior Publication Data

US 2015/0262621 A1   Sep. 17, 2015

(51) Int. Cl.
| | |
|---|---|
| G11C 16/04 | (2006.01) |
| G11C 16/08 | (2006.01) |
| G11C 16/10 | (2006.01) |
| G11C 8/08 | (2006.01) |
| G11C 8/10 | (2006.01) |
| G11C 8/14 | (2006.01) |

(52) U.S. Cl.
CPC *G11C 16/08* (2013.01); *G11C 8/08* (2013.01); *G11C 8/10* (2013.01); *G11C 8/14* (2013.01); *G11C 16/0483* (2013.01); *G11C 16/10* (2013.01)

(58) Field of Classification Search
CPC .. G11C 7/1051; G11C 7/1045; G11C 7/0485; G11C 7/22; G11C 8/08; G11C 16/08; G11C 16/10; G11C 16/0483
USPC ............. 365/185.17, 189.01, 189.05, 189.08, 365/230.06, 63
See application file for complete search history.

(56) References Cited

U.S. PATENT DOCUMENTS

| | | | |
|---|---|---|---|
| 6,218,695 B1 | 4/2001 | Nachumovsky | |
| 2002/0085419 A1* | 7/2002 | Kwon et al. | 365/185.17 |
| 2007/0253263 A1* | 11/2007 | Noda | 365/201 |
| 2007/0297232 A1* | 12/2007 | Iwata | 365/185.17 |
| 2010/0103723 A1* | 4/2010 | Kawai et al. | 365/163 |
| 2011/0267883 A1 | 11/2011 | Lee et al. | |

* cited by examiner

*Primary Examiner* — Gene Auduong
(74) *Attorney, Agent, or Firm* — Winston Hsu; Scott Margo

(57) ABSTRACT

A non-volatile memory cell includes a plurality of rows of memory cells, a plurality of bit lines coupled to the plurality of rows of memory cells for accessing data to the plurality of rows of memory cells, a plurality of word lines each coupled to a corresponding row of memory cells, and a decoder coupled to the plurality of word lines for enabling at least one row of memory cells of the plurality of rows of memory cells.

8 Claims, 7 Drawing Sheets

NON-VOLATILE MEMORY WHICH CAN INCREASE THE OPERATION WINDOW

BACKGROUND OF THE INVENTION

1. Field of the Invention

The present invention illustrates non-volatile memory (NVM), and more particularly, non-volatile memory using a multi-cells selection method to increase the operation window.

2. Description of the Prior Art

Memory is widely used in various electronic devices for data storage in recent years. Like memory cards in digital cameras, random access memory (RAM) and flash memory in computers, memory is manufactured in the form of an integrated circuit for electronic applications. Generally, memory can be classified into two types, named volatile memory (VM) and non-volatile memory (NVM). As it is well known in the art, non-volatile memory has an electronic property that data stored in the non-volatile memory will not volatilize after power is turned off. This electronic property makes non-volatile memory receive more attention in the use of hard disk (HD) drives, erasable programmable read-only memory (EPROM), electrically erasable programmable read-only memory (EEPROM), and flash memory.

As aforementioned, non-volatile memory is manufactured as an integrated circuit, where the circuit includes a plurality of bit lines, a plurality of word lines, and a plurality of memory cells. Specifically, the plurality of bit lines are coupled to the plurality of rows of memory cells. The plurality of word lines each coupled to a corresponding row of memory cells. When the word line enables the corresponding row of memory cells, the data can be accessed (erased/written) to the corresponding row of memory cells through the bit line. With enabling the memory cells row by row, data can be sequentially accessed to all the memory cells.

Please refer to FIG. 1. FIG. 1 illustrates the layout structure of a conventional non-volatile memory. In FIG. 1, each word line controls the floating gates of a corresponding row of memory cells. For example, the word line $WL_1$ controls the first row of floating gates $FG1_1$ to $FG1_5$ with respect to the first row of memory cells. The word line $WL_2$ controls the second row of floating gates $FG2_1$ to $FG2_5$ with respect to the second row of memory cells. The word line $WL_3$ controls the third row of floating gates $FG3_1$ to $FG3_5$ with respect to the third row of memory cells. The word line $WL_4$ controls the fourth row of floating gates $FG4_1$ to $FG4_5$ with respect to the fourth row of memory cells. Since the floating gate controls the input current of the corresponding memory cell, the word lines $WL_1$ to $WL_4$ respectively control the first to the fourth row of memory cells for accessing data by operating on the corresponding floating gates.

Particularly, in conventional non-volatile memory, since the input current for accessing data in each memory cell is small, as time passes by, the voltage offset (i.e., the offset of threshold voltage in each memory cell for data accessing) increases and results in narrowing the operation window of memory, lowering endurance of memory.

Please refer to FIG. 2. FIG. 2 depicts the current distribution of the conventional non-volatile memory in one operation instance. The Y-axis (vertical axis) denotes the number of memory cell and the X-axis (horizontal axis) denotes the un-normalized current intensity of each memory cell. In FIG. 2, the current distribution is presented as a line with circular markers. Specifically, the current distribution has two peak regions P1 and P2. Each peak region locates the local maximum of the distribution curve. The first peak region P1 denotes the number of memory cell used for accessing the low voltage data. The second peak region P2 denotes the number of memory cell used for accessing the high voltage data. The difference of the current of the memory cell between a first value within the first peak region P1 (i.e., within the current intensity interval 1 to 6 in X-axis) and a second value within the second peak region P2 (i.e., within the current intensity interval 26 to 31 in X-axis) is defined as the operation window. In FIG. 2, the first value is chosen to be about 4. The second value is chosen to be about 30. Apparently, Since the word lines enables the conventional non-volatile memory cells row by row, the operation window in FIG. 1 has a narrow width and thus results in low tolerance of the voltage offset through the use of time, leading to low endurance of the non-volatile memory.

To improve the endurance of memory, a prior art method has been developed. The main idea is to use a metal jumper to connect the ends of some of the bit lines together, causing the connection of bit lines to be fixed.

SUMMARY OF THE INVENTION

According to the claimed invention, the non-volatile memory includes a plurality of rows of memory cells, a plurality of bit lines coupled to the plurality of rows of memory cells for accessing data to the plurality of rows of memory cells, a plurality of word lines each coupled to a corresponding row of memory cells, and a decoder coupled to the plurality of word lines for enabling at least one row of memory cells of the plurality of rows of memory cells.

According to the claimed invention, one method for controlling the non-volatile memory includes: enabling a first word line of the plurality of word lines according to an optional signal and at least one decoded address signal, and accessing data to a row of memory cells coupled to the first word line through the bit lines while the first word line is enabled.

According to the claimed invention, another method for controlling a non-volatile memory includes: enabling the plurality of word lines when an optional signal has a predetermined logic value, and accessing data to the plurality of rows of memory cells coupled to the plurality of word lines through the bit lines while the plurality of word lines are enabled.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
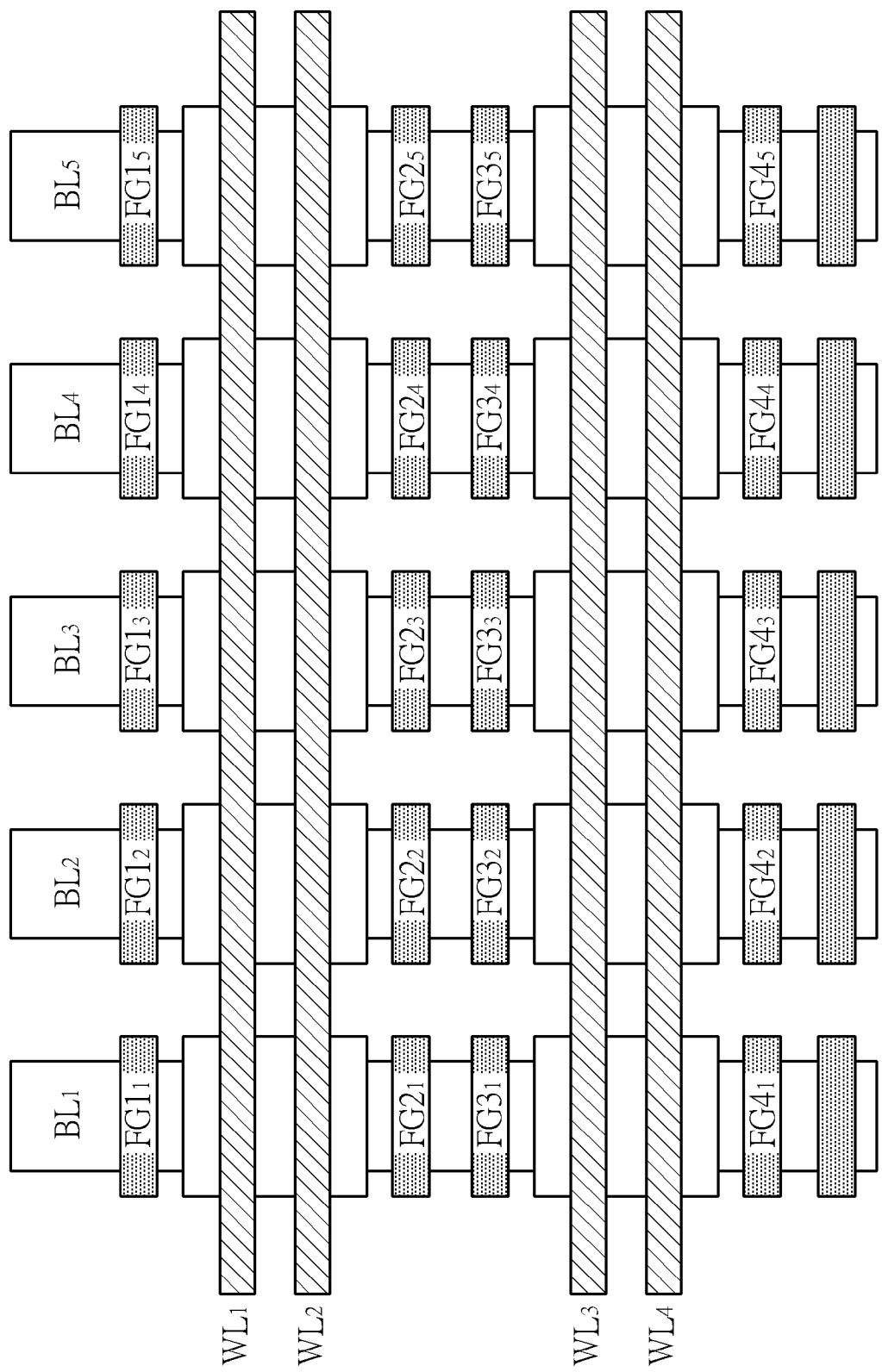
FIG. 1 is a schematic layout structure of the conventional non-volatile memory.
Figure 2:
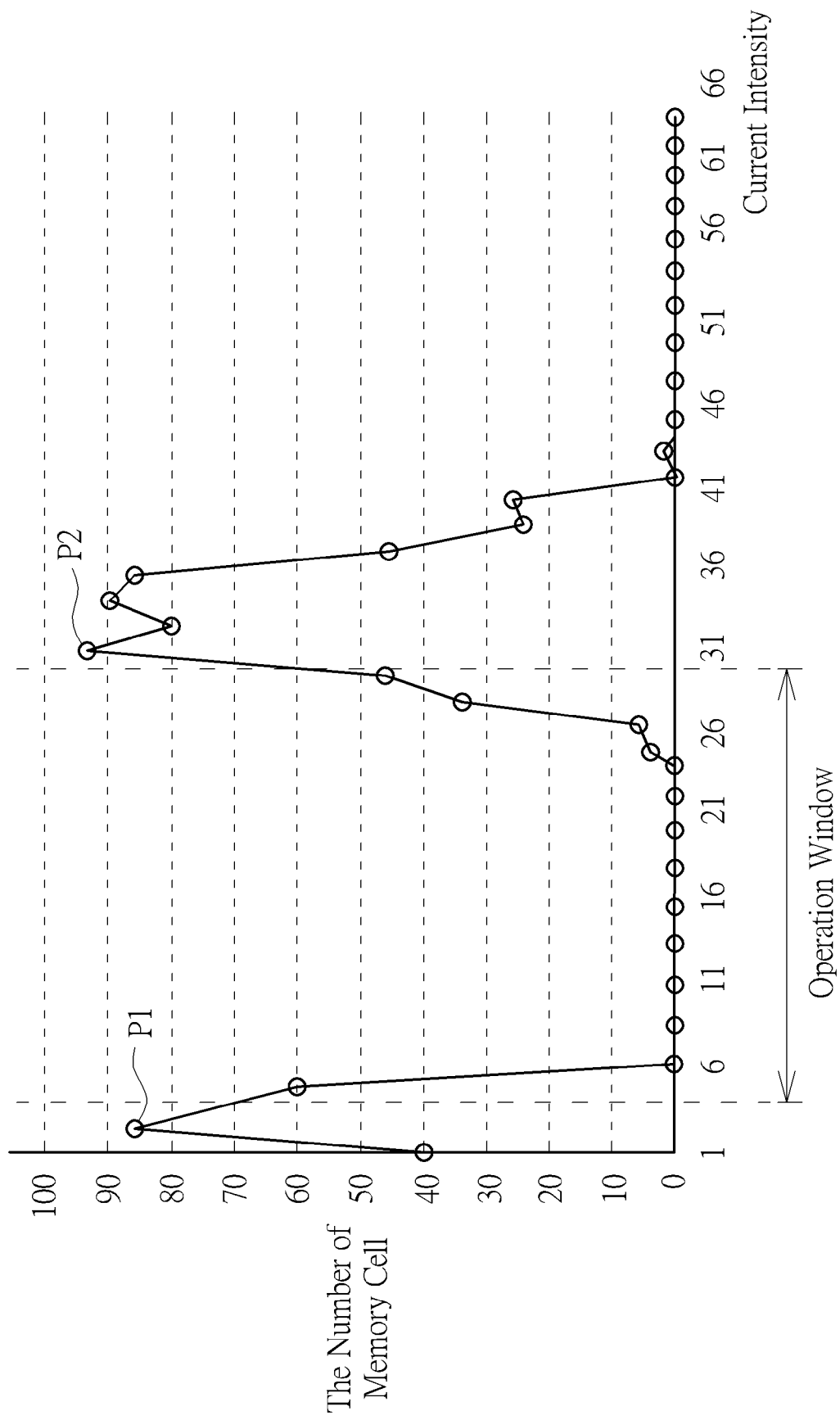
FIG. 2 is current distribution of the conventional non-volatile memory in one operation instance.
Figure 3:
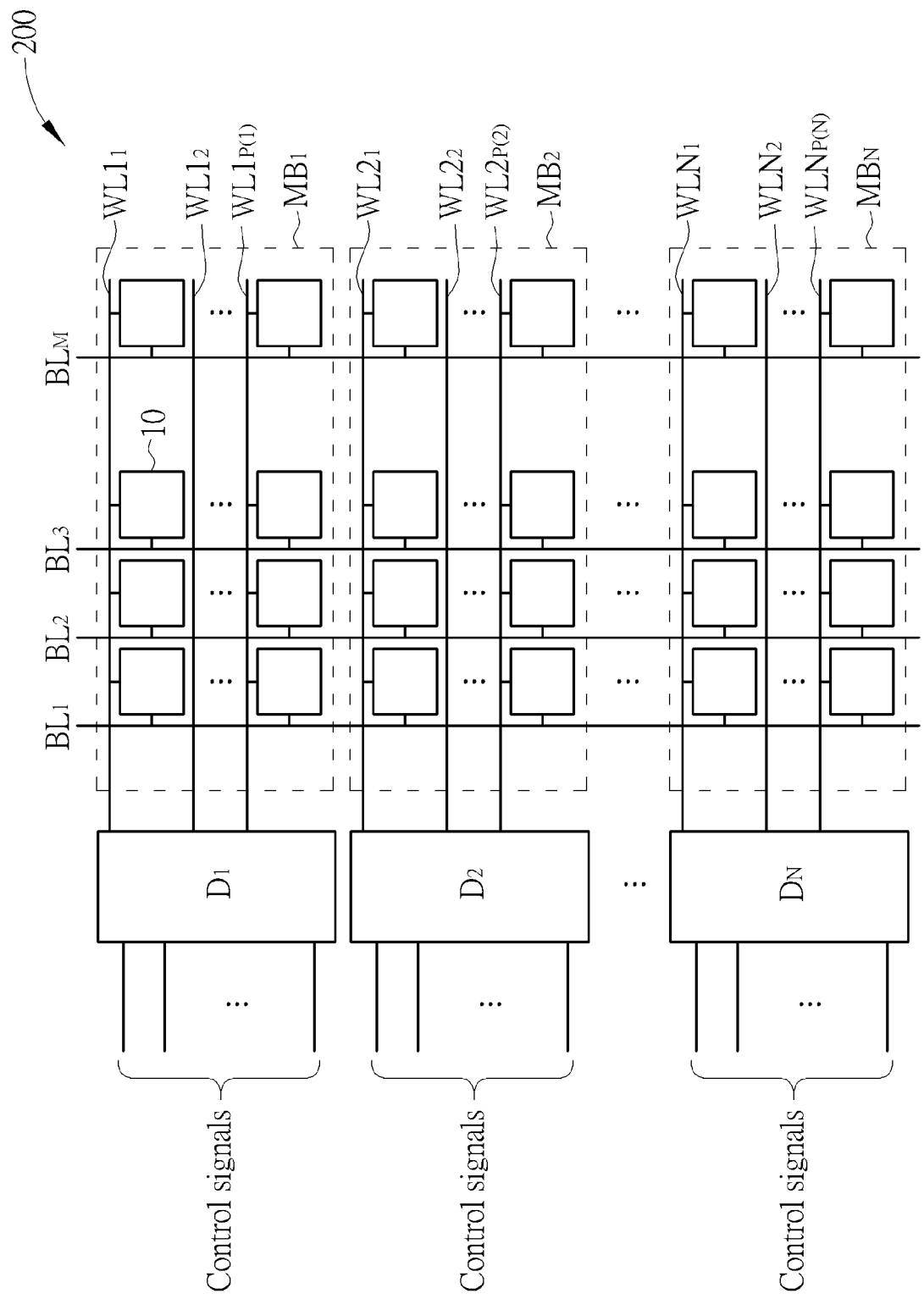
FIG. 3 is a schematic circuit structure of non-volatile memory according to an embodiment of the present invention.

Please refer to FIG. 3. FIG. 3 is the schematic circuit structure of non-volatile memory according to an embodiment of the present invention. As shown in FIG. 3, the non-volatile memory 200 includes a plurality of memory cells 10, a plurality of bit lines $BL_1$ to $BL_M$ coupled to the plurality of memory cells for accessing data to the plurality of memory cells 10, a plurality of word lines $WL1_1$ to $WL1_{P(1)}$, $WL2_1$ to $WL2_{P(2)}$, ..., $WLN_1$ to $WLN_{P(N)}$ each coupled to a corresponding row of memory cells, and a plurality of decoders $D_1$ to $D_N$ each coupled to a plurality of word lines to enable at least one row of memory cells of a plurality of rows of memory cells according to the control signals. Here, M and N are positive integers. P(x) is a function of x where P(x) can be a positive integer or equal to $2^n$. In FIG. 3, the first decoder $D_1$ is coupled to P(1) word lines including word lines $WL1_1$ to $WL1_{P(1)}$. The second decoder $D_2$ is coupled to P(2) word lines including word lines $WL2_1$ to $WL2_{P(2)}$. The Nth decoder $D_N$ is coupled to P(N) word lines including word lines $WLN_1$ to $WLN_{P(N)}$. The positive values P(1), P(2), ..., and P(N) can be identical or different. For convenience, we group the memory cells 10 into memory banks $MB_1$ to $MB_N$ in the non-volatile memory 200. As shown in FIG. 3, each memory bank includes a plurality of rows of memory cells with respect to the corresponding decoder. For example, the first memory bank $MB_1$ contains P(1) rows of memory cells with respect to the first decoder $D_1$. The second memory bank $MB_2$ contains P(2) rows of memory cells with respect to the second decoder $D_2$. The Nth memory bank $MB_N$ contains P(N) rows of memory cells with respect to the Nth decoder $D_N$.

Figure 4:
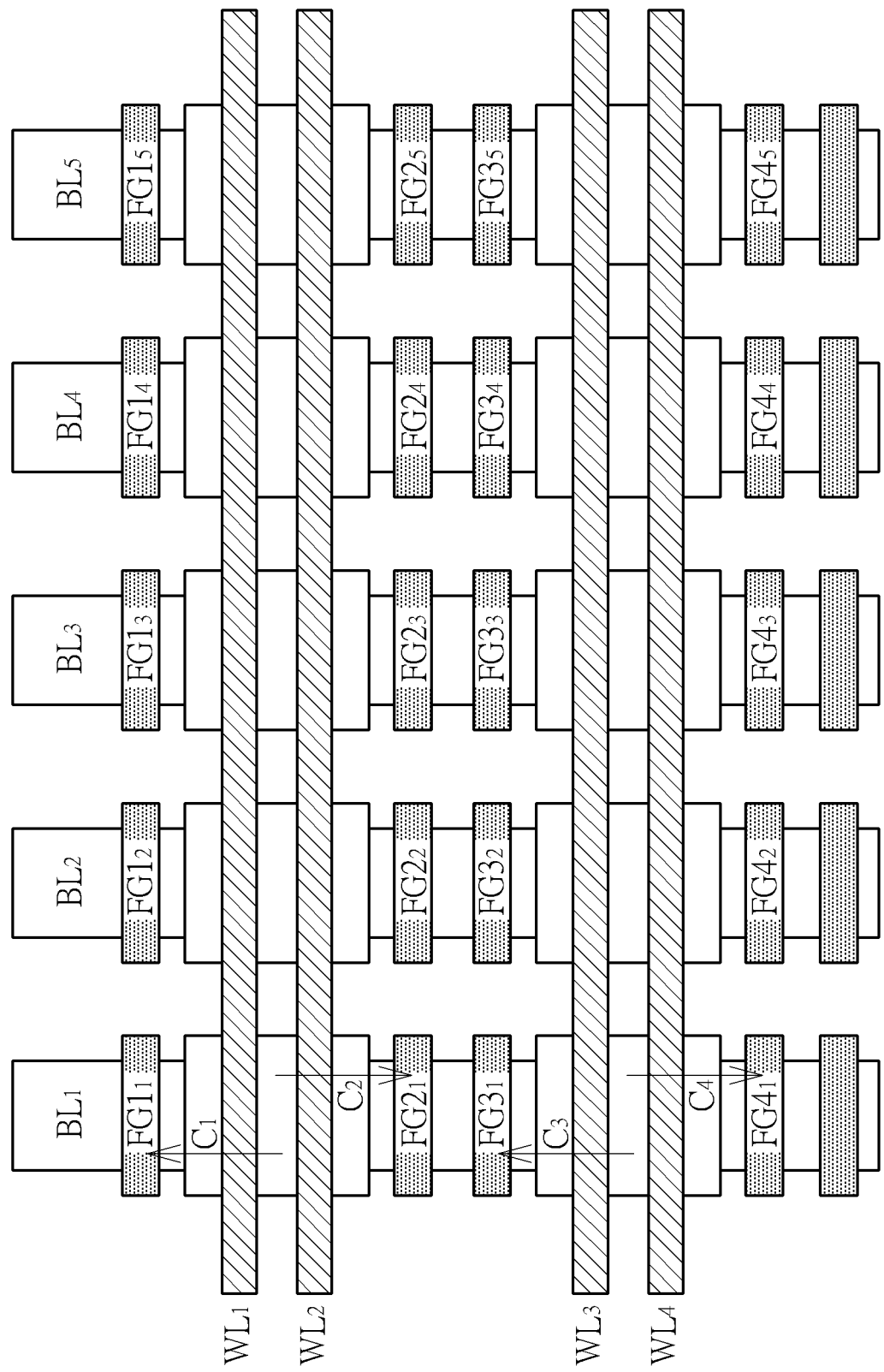
FIG. 4 is a schematic layout structure of the non-volatile memory according to an embodiment of the present invention.

In the following, two operation modes of the decoder are introduced in the embodiments. The first operation mode indicates that all the word lines are enabled simultaneously. The second operation mode indicates that the word lines are enabled line-by-line. Please refer to FIG. 4. FIG. 4 illustrates the layout structure of the non-volatile memory in a memory bank according to an embodiment of the present invention. In FIG. 4, each word line controls the floating gates of a corresponding row of memory cells. When the memory is performed under the first operation mode by enabling all word lines of a memory bank, the current of each accessed memory cell increases by a couple of times and thus increases the endurance of the memory. For example, in FIG. 4, when the word lines $WL_1$ to $WL_4$ are enabled simultaneously, the input currents $C_1$ to $C_4$ corresponding to the floating gate $FG1_1$ to $FG4_1$ of the memory cells coupled to the first bit line $BL_1$ are jointly used for accessing data. As a result, the total current of the memory cells coupled to the first bit line $BL_1$ becomes the summation of $C_1$ to $C_4$ and thus yields to high endurance of the memory. In the present application, the word lines in a memory bank can be controlled by a decoder for performing the first operation mode and the second operation mode of the memory. The embodiments and the detail illustrations of the decoders used to control the memory are described below.

Figure 5:
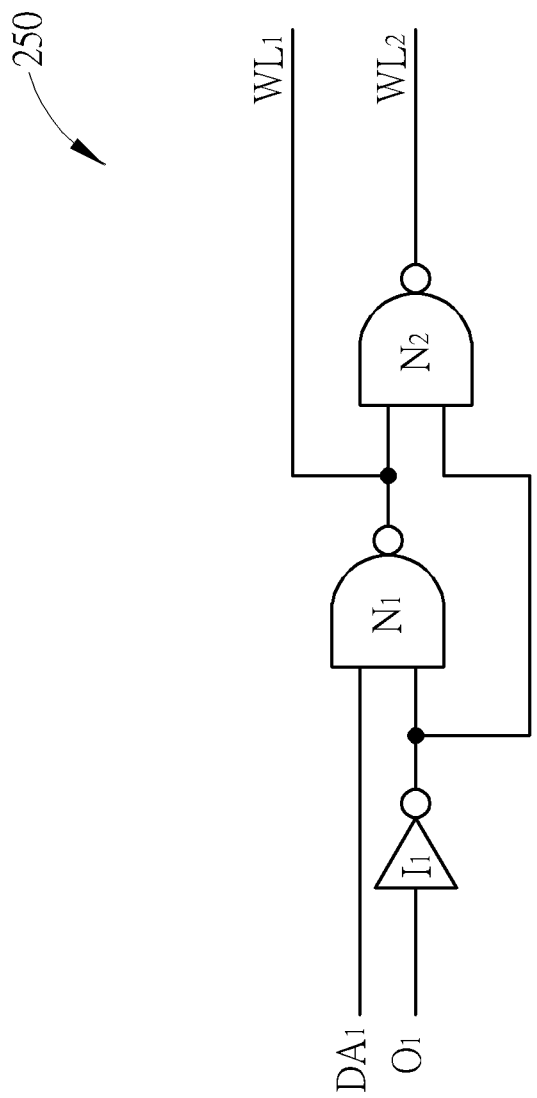
FIG. 5 is a logic circuit for the decoder of the first embodiment in the present invention.

Please refer to FIG. 5. FIG. 5 is a logic circuit for the decoder 250 of the first embodiment in the present invention. The decoder 250 includes an inverter $I_1$, a first NAND gate $N_1$, and a second NAND gate $N_2$. The inverter $I_1$ includes an input terminal for receiving an optional signal $O_1$, and an output terminal. The first NAND gate $N_1$ includes a first input terminal for receiving a decoded address signal $DA_1$, a second input terminal coupled to the output terminal of the inverter $I_1$, and an output terminal coupled to a first word line $WL_1$. The second NAND gate $N_2$ includes a first input terminal coupled to the output terminal of the first NAND gate $N_1$, a second input terminal coupled to the output terminal of the inverter $I_1$, and an output terminal coupled to a second word line $WL_2$. In this embodiment, for presentation simplicity, we use the Boolean algebra expressions to present all signals (i.e., all signals are modeled by the integers "0" and "1", where "0" denotes the signal bearing low voltage and "1" denotes the signal bearing high voltage). In the decoder 250, when the optional signal $O_1$ is "1", through the inverter $I_1$, the second input terminal of the first NAND gate $N_1$ receives the signal "0" and thus the output terminal of the first NAND gate $N_1$ always outputs the signal "1" (i.e., in a NAND gate, when one of the input terminal receives the signal "0", the output terminal always outputs the signal "1"). Similarly, the second input terminal of the second NAND gate $N_2$ receives the signal "0" and thus the output terminal of the second NAND gate $N_2$ always outputs the signal "1". As a result, both the first word line $WL_1$ and the second word line $WL_2$ receive the signal "1" and are enabled simultaneously. That implements the first operation mode of the decoder 250.

When the optional signal $O_1$ is "0", through the inverter $I_1$, the second input terminal of the first NAND gate $N_1$ receives the signal "1" and the second input terminal of the second NAND gate $N_2$ receives the signal "1". In the embodiment, the optional signal $O_1$ being "0" is the necessary condition to perform the second operation mode of the decoder 250. In the following, the word lines are enabled line by line according to two steps, as described below.

In the first step, when the decoded address signal $DA_1$ is "0", the output terminal of the first NAND gate $N_1$ outputs the signal "1" so that the output terminal of the second NAND gate $N_2$ outputs the signal "0". As a result, the first word line $WL_1$ receives the signal "1" and is enabled. The second word line $WL_2$ receives the signal "0" and is disabled.

In the second step, when the decoded address signal $DA_1$ is "1", the output terminal of the first NAND gate $N_1$ outputs the signal "0" so that the output terminal of the second NAND gate $N_2$ outputs the signal "1". As a result, the first word line $WL_1$ receives the signal "0" and is disabled. The second word line $WL_2$ receives the signal "1" and is enabled.

In this embodiment, when the decoder 250 performs the first operation mode, both the first word line $WL_1$ and the second word line $WL_2$ are enabled with the optional signal $O_1$ being "1". When the decoder 250 performs the second operation mode, one of the first word line $WL_1$ and the second word line $WL_2$ is enabled in each step according to the decoded addressed signal $DA_1$, with the optional signal $O_1$ being "0.

Figure 6:
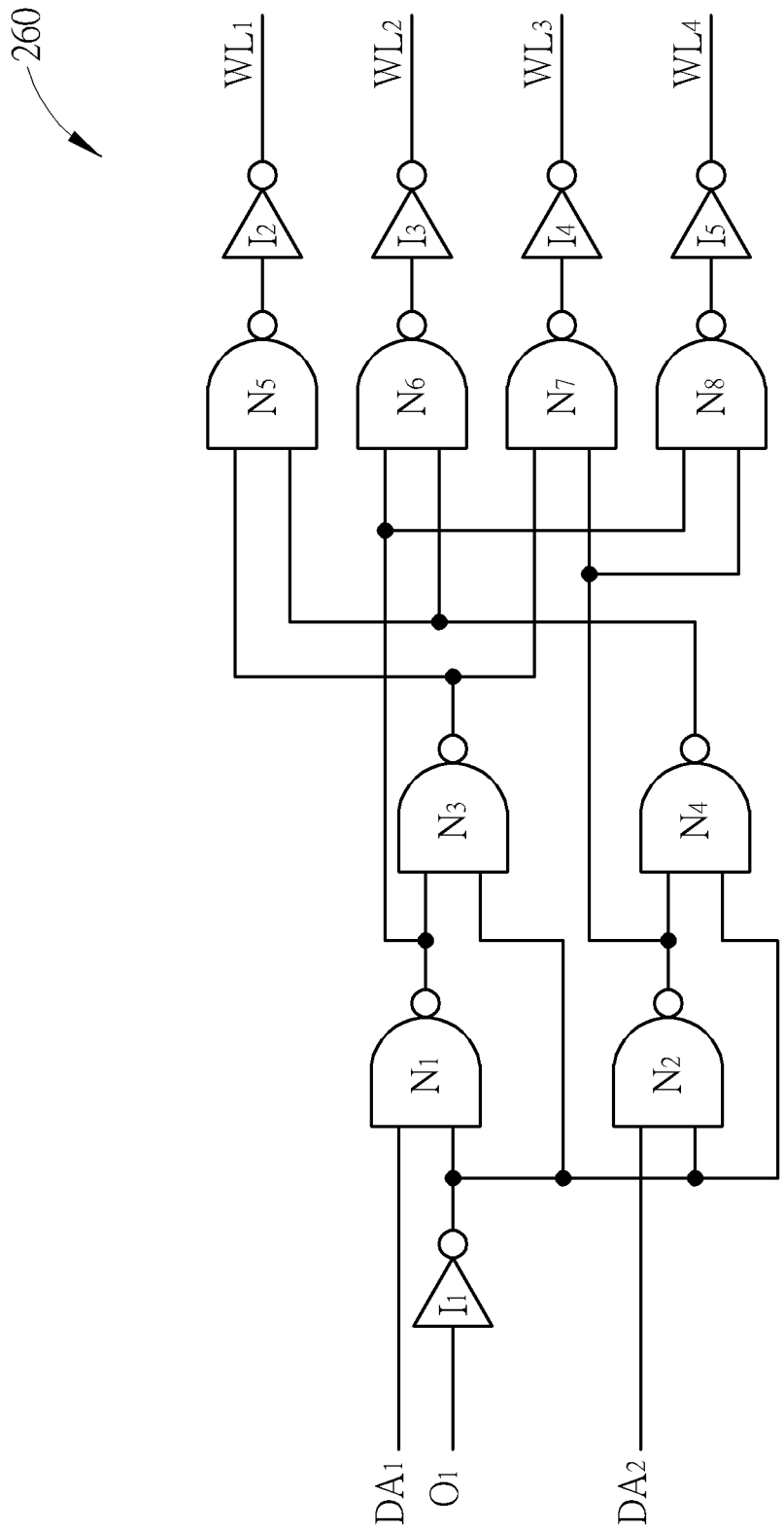
FIG. 6 is a logic circuit for the decoder of the second embodiment in the present invention.

Please refer to FIG. 6. FIG. 6 is a logic circuit for the decoder 260 of the second embodiment in the present invention. The decoder 260 includes a first inverter $I_1$, a second inverter $I_2$, a third inverter $I_3$, a fourth inverter $I_4$, a fifth inverter $I_5$, a first NAND gate $N_1$, a second NAND gate $N_2$, a third NAND gate $N_3$, a fourth NAND gate $N_4$, a fifth NAND gate $N_5$, a sixth NAND gate $N_6$, a seventh NAND gate $N_7$, and an eighth NAND gate $N_8$. The first inverter $I_1$ includes an input terminal for receiving an optional signal $O_1$, and an output terminal. The first NAND gate $N_1$ includes a first input terminal for receiving a first decoded address signal $DA_1$, a second input terminal coupled to the output terminal of the first inverter $I_1$, and an output terminal. The second NAND gate $N_2$ includes a first input terminal for receiving a second decoded address signal $DA_2$, a second input terminal coupled to the output terminal of the first inverter $I_1$, and an output terminal. The third NAND gate $N_3$ includes a first input terminal coupled to the output terminal of the first NAND gate $N_1$, a second input terminal coupled to the output terminal of the first inverter $I_1$, and an output terminal. The fourth NAND gate $N_4$ includes a first input terminal coupled to the output terminal of the second NAND gate $N_2$, a second input terminal coupled to the output terminal of the first inverter $I_1$, and an output terminal. The fifth NAND gate $N_5$ includes a first input terminal coupled to the output terminal of the third NAND gate $N_3$, a second input terminal coupled to the output terminal of the fourth NAND gate $N_4$, and an output terminal. The sixth NAND gate $N_6$ includes a first input terminal coupled to the output terminal of the first NAND gate $N_1$, a second input terminal coupled to the output terminal of the fourth NAND gate $N_4$, and an output terminal. The seventh NAND gate $N_7$ includes a first input terminal coupled to the output terminal of the third NAND gate $N_3$, a second input terminal coupled to the output terminal of the second NAND gate $N_2$, and an output terminal. The eighth NAND gate $N_8$ includes a first input terminal coupled to the output terminal of the first NAND gate $N_1$, a second input terminal coupled to the output terminal of the second NAND gate $N_2$, and an output terminal. The second inverter $I_2$ includes an input terminal coupled to the output terminal of the fifth NAND gate $N_5$, and an output terminal coupled to a first word line $WL_1$. The third inverter $I_3$ includes an input terminal coupled to the output terminal of the sixth NAND gate $N_6$, and an output terminal coupled to a second word line $WL_2$. The fourth inverter $I_4$ includes an input terminal coupled to the output terminal of the seventh NAND gate $N_7$, and an output terminal coupled to a third word line $WL_3$. The fifth inverter $I_5$ includes an input terminal coupled to the output terminal of the eighth NAND gate $N_8$, and an output terminal coupled to a fourth word line $WL_4$.

In this embodiment, we also use the Boolean algebra expressions to present all signals for presentation simplicity. In decoder 260, when the optional signal $O_1$ is "1", through the first inverter $I_1$, the second input terminal of the first NAND gate $N_1$ receives the signal "0" and thus the output terminal of the first NAND gate $N_1$ always outputs the signal "1" (i.e., as mentioned above, the output terminal of the NAND gate always outputs the signal "1" when one of the input terminal receives the signal "0"). Similarly, the second input terminal of the second NAND gate $N_2$ receives the signal "0" and thus the output terminal of the second NAND gate $N_2$ always outputs the signal "1". The first input terminal of the third NAND gate $N_3$ receives the signal "1" and second input terminal of the third NAND gate $N_3$ receives the signal "0" so that the output terminal of the third NAND gate $N_3$ outputs the signal "1". Similarly, the first input terminal of the fourth NAND gate $N_4$ receives the signal "1" and second input terminal of the fourth NAND gate $N_4$ receives the signal "0" so that the output terminal of the fourth NAND gate $N_4$ outputs the signal "1". As a result, both the first input terminal and the second terminal of the fifth NAND gate $N_5$, the sixth NAND gate $N_6$, the seventh NAND gate $N_7$, and the eighth NAND gate $N_8$ receive the signal "1" so that the output terminals of these NAND gates $N_5$ to $N_8$ output the signal "0". Since the output signals from the fifth NAND gate $N_5$, the sixth NAND gate $N_6$, the seventh NAND gate $N_7$, and the eighth NAND gate $N_8$ are respectively processed through the second inverter $I_2$, the third inverter $I_3$, the fourth inverter $I_4$, and the fifth inverter $I_5$, the output terminals of the inverters $I_2$ to $I_5$ output the signals "1". As a result, the first word line $WL_1$, the second word line $WL_2$, the third word line $WL_3$, and the fourth word line $WL_4$ are enabled simultaneously. That implements the first operation mode.

When the optional signal $O_1$ is "0", through the first inverter $I_1$, the second input terminal of the first NAND gate $N_1$ receives the signal "1", the second input terminal of the second NAND gate $N_2$ receives the signal "1", the second input terminal of the third NAND gate $N_3$ receives the signal "1", and the second input terminal of the fourth NAND gate $N_4$ receives the signal "1". In the embodiment, the optional signal $O_1$ being "0" is the necessary condition to perform the second operation mode of the decoder 260. In the following, the word lines are enabled line-by-line according to four steps, as described below.

In the first step, when the first decoded address signal $DA_1$ is "0" and the second decoded address signal $DA_2$ signal is "0", the output terminal of the first NAND gate $N_1$ outputs the signal "1" and the output terminal of the second NAND gate $N_2$ outputs the signal "1" so that the output terminal of the third NAND gate $N_3$ outputs the signal "0" and the output terminal of the fourth NAND gate $N_4$ outputs the signal "0". Thus, the first input terminal of the fifth NAND gate $N_5$ receives the signal "0" and the second input terminal of the fifth NAND gate $N_5$ receives the signal "0". The first input terminal of the sixth NAND gate $N_6$ receives the signal "1" and the second input terminal of the sixth NAND gate $N_6$ receives the signal "0". The first input terminal of the seventh NAND gate $N_7$ receives the signal "0" and the second input terminal of the seventh NAND gate $N_7$ receives the signal "1". The first input terminal of the eighth NAND gate $N_8$ receives the signal "1" and the second input terminal of the eighth NAND gate $N_8$ receives the signal "1". Thus, the output terminals of the fifth NAND gate $N_5$, the sixth NAND gate $N_6$, and the seventh NAND gate $N_7$ output the signals "1" and the output terminal of the eighth NAND gate $N_8$ outputs the signal "0". Since the output signals from the fifth NAND gate $N_5$, the sixth NAND gate $N_6$, the seventh NAND gate $N_7$, and the eighth NAND gate $N_8$ are respectively processed through the second inverter $I_2$, the third inverter $I_3$, the fourth inverter $I_4$, and the fifth inverter $I_5$, the output terminals of the inverters $I_2$ to $I_4$ output the signals "0" and the output terminal of the inverter $I_5$ outputs the signal "1". As a result, the first word line $WL_1$, the second word line $WL_2$, the third word line $WL_3$ are disabled and the fourth word line $WL_4$ is enabled.

In the second step, when the first decoded address signal $DA_1$ is "0" and the second decoded address signal $DA_2$ is "1", the output terminal of the first NAND gate $N_1$ outputs the signal "1" and the output terminal of the second NAND gate $N_2$ outputs the signal "0" so that the output terminal of the third NAND gate $N_3$ outputs the signal "0" and the output terminal of the fourth NAND gate $N_4$ outputs the signal "1". Thus, the first input terminal of the fifth NAND gate $N_5$ receives the signal "0" and the second input terminal of the fifth NAND gate $N_5$ receives the signal "1". The first input terminal of the sixth NAND gate $N_6$ receives the signal "1" and the second input terminal of the sixth NAND gate $N_6$ receives the signal "1". The first input terminal of the seventh NAND gate $N_7$ receives the signal "0" and the second input terminal of the seventh NAND gate $N_7$ receives the signal "0". The first input terminal of the eighth NAND gate $N_8$ receives the signal "1" and the second input terminal of the eighth NAND gate $N_8$ receives the signal "0". Thus, the output terminals of the fifth NAND gate $N_5$, the seventh NAND gate $N_7$, and the eighth NAND gate $N_8$ output the signals "1" and the output terminal of the sixth NAND gate $N_6$ outputs the signal "0". Since the output signals from the fifth NAND gate $N_5$, the sixth NAND gate $N_6$, the seventh NAND gate $N_7$, and the eighth NAND gate $N_8$ are respectively processed through the second inverter $I_2$, the third inverter $I_3$, the fourth inverter $I_4$, and the fifth inverter $I_5$, the output terminals of the second inverter $I_2$, the fourth inverter $I_4$, and the fifth inverter $I_5$ output the signals "0" and the output terminal of the third inverter $I_3$ outputs the signal "1". As a result, the first word line $WL_1$, the third word line $WL_3$, and the fourth word line $WL_4$ are disabled and the second word line $WL_2$ is enabled.

In the third step, when the first decoded address signal $DA_1$ is "1" and the second decoded address signal $DA_2$ is "0", the output terminal of the first NAND gate $N_1$ outputs the signal "0" and the output terminal of the second NAND gate $N_2$ outputs the signal "1" so that the output terminal of the third NAND gate $N_3$ outputs the signal "1" and the output terminal of the fourth NAND gate $N_4$ outputs the signal "0". Thus, the first input terminal of the fifth NAND gate $N_5$ receives the signal "1" and the second input terminal of the fifth NAND gate $N_5$ receives the signal "0". The first input terminal of the sixth NAND gate $N_6$ receives the signal "0" and the second input terminal of the sixth NAND gate $N_6$ receives the signal "0". The first input terminal of the seventh NAND gate $N_7$ receives the signal "1" and the second input terminal of the seventh NAND gate $N_7$ receives the signal "1". The first input terminal of the eighth NAND gate $N_8$ receives the signal "0" and the second input terminal of the eighth NAND gate $N_8$ receives the signal "1". Thus, the output terminals of the fifth NAND gate $N_5$, the sixth NAND gate $N_6$, and the eighth NAND gate $N_8$ output the signals "1" and the output terminal of the seventh NAND gate $N_7$ outputs the signal "0". Since the output signals from the fifth NAND gate $N_5$, the sixth NAND gate $N_6$, the seventh NAND gate $N_7$, and the eighth NAND gate $N_8$ are respectively processed through the second inverter $I_2$, the third inverter $I_3$, the fourth inverter $I_4$, and the fifth inverter $I_5$, the output terminals of the second inverter $I_2$, the third inverter $I_3$, and the fifth inverter $I_5$ output the signals "0" and the output terminal of the fourth inverter $I_4$ outputs the signal "1". As a result, the first word line $WL_1$, the second word line $WL_2$, and the fourth word line $WL_4$ are disabled and the third word line $WL_3$ is enabled.

In the fourth step, when the first decoded address signal $DA_1$ is "1" and the second decoded address signal $DA_2$ is "1", the output terminal of the first NAND gate $N_1$ outputs the signal "0" and the output terminal of the second NAND gate $N_2$ outputs the signal "0" so that the output terminal of the third NAND gate $N_3$ outputs the signal "1" and the output terminal of the fourth NAND gate $N_4$ outputs the signal "1". Thus, the first input terminal of the fifth NAND gate $N_5$ receives the signal "1" and the second input terminal of the fifth NAND gate $N_5$ receives the signal "1". The first input terminal of the sixth NAND gate $N_6$ receives the signal "0" and the second input terminal of the sixth NAND gate $N_6$ receives the signal "1". The first input terminal of the seventh NAND gate $N_7$ receives the signal "1" and the second input terminal of the seventh NAND gate $N_7$ receives the signal "0". The first input terminal of the eighth NAND gate $N_8$ receives the signal "0" and the second input terminal of the eighth NAND gate $N_8$ receives the signal "0". Thus, the output terminals of the sixth NAND gate $N_6$, the seventh NAND gate $N_7$, and the eighth NAND gate $N_8$ output the signals "1" and the output terminal of the fifth NAND gate $N_5$ outputs the signal "0". Since the output signals from the fifth NAND gate $N_5$, the sixth NAND gate $N_6$, the seventh NAND gate $N_7$, and the eighth NAND gate $N_8$ are respectively processed through the second inverter $I_2$, the third inverter $I_3$, the fourth inverter $I_4$, and the fifth inverter $I_5$, the output terminals of the third inverter $I_3$, the fourth inverter $I_4$, and the fifth inverter $I_5$ output the signals "0" and the output terminal of the second inverter $I_2$ outputs the signal "1". As a result, the second word line $WL_2$, the third word line $WL_3$, and the fourth word line $WL_4$ are disabled and the first word line $WL_1$ is enabled.

In this embodiment, when the decoder 260 performs the first operation mode, all the word lines $WL_1$ to $WL_4$ are enabled with the optional signal $O_1$ being "1". When the decoder 260 performs the second operation mode, one of the word lines $WL_1$ to $WL_4$ is enabled in each step according to the decoded addressed signals $DA_1$ and $DA_2$, with the optional signal $O_1$ being "0".

As shown in the embodiments of FIG. 5 and FIG. 6, the first operation mode of decoder 250, 260 is performed when the optional signal $O_1$ has a predetermined logic value (i.e., in the embodiments, the predetermined logic value is equal to 1) and the second operation mode of decoder 250, 260 is performed when the optional signal $O_1$ has another predetermined logic value (i.e., in the embodiments, the another predetermined logic value is equal to 0).

Referring to FIG. 3 to FIG. 6, since each decoder controls the plurality of rows of memory cell in each memory bank, by choosing appropriate operation mode of the decoder in each memory bank, the memory can provide an adaptive performance of endurance and capacity. For example, since the memory using the first operation mode for accessing data provides larger input current, larger operation window, higher endurance, and smaller capacity than using the second operation mode for accessing data (i.e., larger input current can mitigate the voltage offset with the use of time and thus can enlarge the operation window and improve the endurance of memory), when some memory banks use the first operation mode and the rest memory banks use the second operation mode for accessing data, the memory provides the satisfactory endurance with high capacity.

Figure 7:
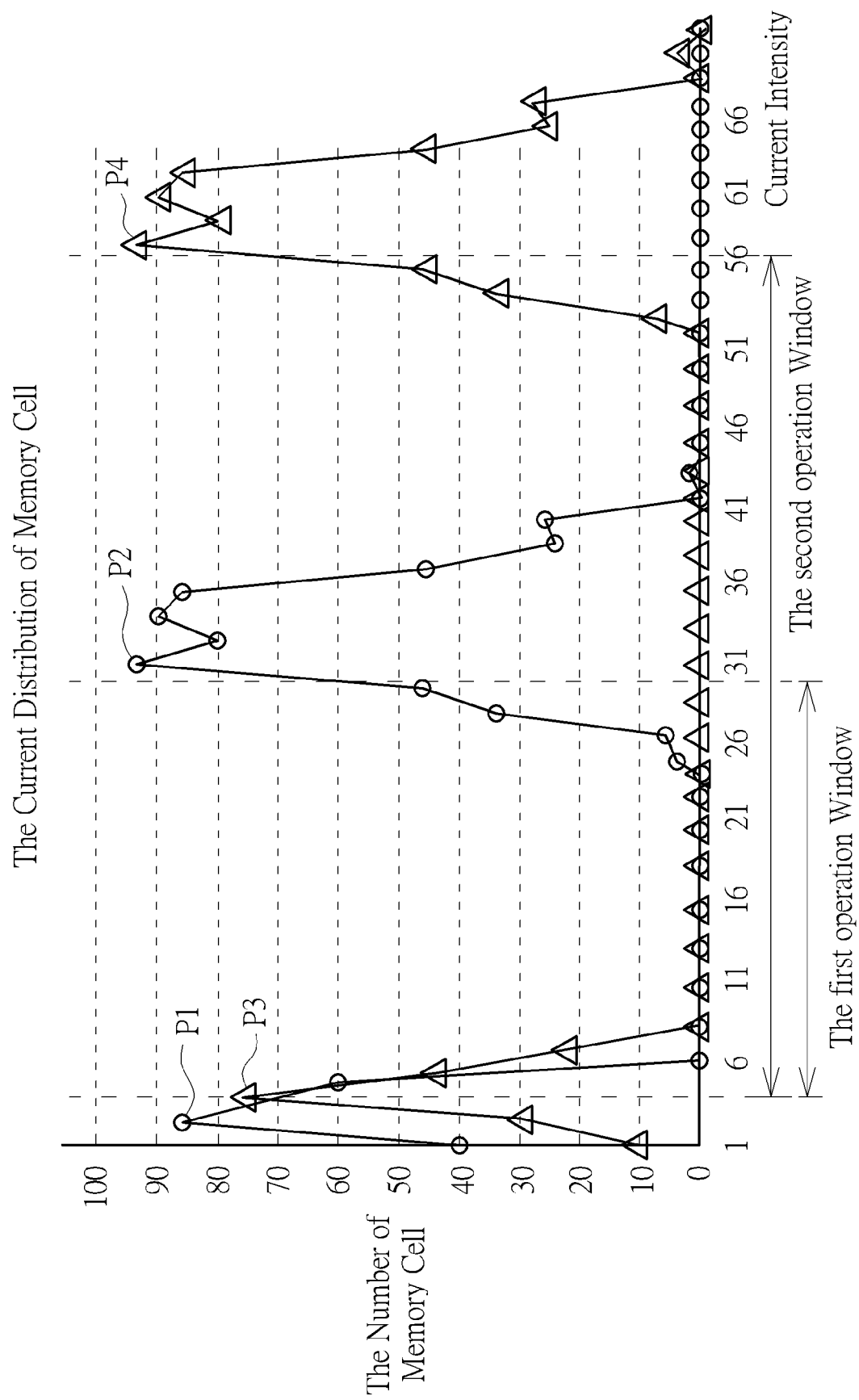
FIG. 7 is current distribution of the non-volatile memory according to an embodiment of the present invention in one operation instance.

Please refer to FIG. 7. FIG. 7 depicts the current distribution of the non-volatile memory according to an embodiment of the present invention in one operation instance. The Y-axis (vertical axis) denotes the number of memory cell and the X-axis (horizontal axis) denotes the un-normalized current intensity of memory cell. Here, the memory contains some memory banks under the first operation mode and some memory banks under the second operation mode. This implies that the memory has two current distributions corresponding to two operation modes. The coexistent two current distributions are shown in FIG. 7. In FIG. 7, the first current distribution corresponding to the first operation mode is presented as a line with circular markers. The second current distribution corresponding to the second operation mode is presented as a line with triangular markers. Specifically, each current distribution has two peak regions. Each peak region locates the local maximum of the distribution curve. The first peak region P1 denotes the number of memory cell used for accessing the low voltage data under the first operation mode. The second peak region P2 denotes the number of memory cell used for accessing the high voltage data under the first operation mode. The third peak region P3 denotes the number of memory cell used for accessing the low voltage data under the second operation mode. The fourth peak region P4 denotes the number of memory cell used for accessing the high voltage data under the second operation mode. The difference of the current of the memory cell under the first operation mode between a value within the first peak region P1 (i.e., within the current intensity interval 1 to 6 in X-axis) and a value within the second peak region P2 (i.e., within the current intensity interval 26 to 31 in X-axis) is defined as the first operation window. The difference of the current of the memory cell under the second operation mode between a value within the third peak region P3 (i.e., within the current intensity interval 1 to 6 in X-axis) and a value within the fourth peak region P4 (i.e., within the current intensity interval 56 to 61 in X-axis) is defined as the second operation window.

Particularly, in FIG. 7, when the first operation mode is performed in some memory banks by enabling the memory cells row by row, the memory cells in these memory banks provide high capacity with basic endurance since the first operation window has a narrow width. When the second operation mode is performed in some memory banks by enabling all the memory cells simultaneously, the memory cells in these memory banks provide low capacity with high endurance since the second operation window has a wide width. Because the memory coexists the first operation mode with respect to the first operation window and the second operation mode with respect to the second operation window for accessing data, the satisfactory endurance in conjunction with high capacity can be provided by the memory.

In the present invention, a multi-cells selection method is used in non-volatile memory to enlarge the operation window and improve the endurance. The key idea is to control the plurality of word lines in each memory bank by a decoder. Two operation modes for controlling word lines are further introduced. Specifically, the operation modes in each memory bank can be appropriately adjusted so that the memory can be used for the applications with different endurance and capacity requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory comprising:
   a plurality of rows of memory cells;
   a plurality of bit lines coupled to the plurality of rows of memory cells configured to access data to the plurality of rows of memory cells;
   a plurality of word lines each coupled to a corresponding row of memory cells; and
   a decoder coupled to the plurality of word lines configured to enable at least two rows of memory cells of the plurality of rows of memory cells.

2. The non-volatile memory of claim 1 wherein the decoder comprises:
   an inverter, comprising:
     an input terminal configured to receive an optional signal; and
     an output terminal;
   a first NAND gate, comprising:
     a first input terminal configured to receive a decoded address signal;
     a second input terminal coupled to the output terminal of the inverter; and
     an output terminal coupled to a first word line of the plurality of word lines; and
   a second NAND gate, comprising:
     a first input terminal coupled to the output terminal of the first NAND gate;
     a second input terminal coupled to the output terminal of the inverter; and
     an output terminal coupled to a second word line of the plurality of word lines.

3. The non-volatile memory of claim 1 wherein the decoder comprises:
   a first inverter, comprising:
     an input terminal configured to receive an optional signal; and
     an output terminal;
   a first NAND gate, comprising:
     a first input terminal configured to receive a first decoded address signal;
     a second input terminal coupled to the output terminal of the first inverter; and
     an output terminal;
   a second NAND gate, comprising:
     a first input terminal configured to receive a second decoded address signal;
     a second input terminal coupled to the output terminal of the first inverter; and
     an output terminal;
   a third NAND gate, comprising:
     a first input terminal coupled to the output terminal of the first NAND gate;
     a second input terminal coupled to the output terminal of the first inverter; and
     an output terminal;
   a fourth NAND gate, comprising:
     a first input terminal coupled to the output terminal of the second NAND gate;
     a second input terminal coupled to the output terminal of the first inverter; and
     an output terminal;
   a fifth NAND gate, comprising:
     a first input terminal coupled to the output terminal of the third NAND gate;
     a second input terminal coupled to the output terminal of the fourth NAND gate; and
     an output terminal;
   a sixth NAND gate, comprising:
     a first input terminal coupled to the output terminal of the first NAND gate;
     a second input terminal coupled to the output terminal of the fourth NAND gate; and
     an output terminal;
   a seventh NAND gate, comprising:
     a first input terminal coupled to the output terminal of the third NAND gate;
     a second input terminal coupled to the output terminal of the second NAND gate; and
     an output terminal;
   an eighth NAND gate, comprising:
     a first input terminal coupled to the output terminal of the first NAND gate;
     a second input terminal coupled to the output terminal of the second NAND gate; and
     an output terminal;
   a second inverter, comprising:
     an input terminal coupled to the output terminal of the fifth NAND gate; and
     an output terminal coupled to a first word line of the plurality of word lines;
   a third inverter, comprising:
     an input terminal coupled to the output terminal of the sixth NAND gate; and
     an output terminal coupled to a second word line of the plurality of word lines;
   a fourth inverter, comprising:
     an input terminal coupled to the output terminal of the seventh NAND gate; and
     an output terminal coupled to a third word line of the plurality of word lines; and
   a fifth inverter, comprising:
     an input terminal coupled to the output terminal of the eighth NAND gate; and an output terminal coupled to a fourth word line of the plurality of word lines.

4. A method for controlling a non-volatile memory, the non-volatile memory comprising a plurality of rows of memory cells, a plurality of bit lines coupled to the plurality of rows of memory cells, and a plurality of word lines each coupled to a corresponding row of memory cells, the method comprising:

enabling a first word line of two word lines according to an optional signal and at least one decoded address signal;

accessing data to a row of memory cells coupled to the first word line through the bit lines while the first word line is enabled;

enabling the two word lines when the optional signal has a predetermined logic value; and accessing data to two rows of memory cells coupled to the two word lines through the bit lines while the two word lines are enabled.

5. A method for controlling a non-volatile memory, the non-volatile memory comprising a plurality of rows of memory cells, a plurality of bit lines coupled to the plurality of rows of memory cells, and a plurality of word lines each coupled to a corresponding row of memory cells, the method comprising:

enabling a first word line of four word lines according to an optional signal and two decoded address signals;

accessing data to a row of memory cells coupled to the first word line through the bit lines while the first word line is enabled;

enabling the four word lines when the optional signal has a predetermined logic value; and accessing data to four rows of memory cells coupled to the four word lines through the bit lines while the four word lines are enabled.

6. A method for controlling a non-volatile memory, the non-volatile memory comprising a plurality of rows of memory cells, a plurality of bit lines coupled to the plurality of rows of memory cells, and a plurality of word lines each coupled to a corresponding row of memory cells of the plurality of rows of memory cells, the method comprising:

enabling the plurality of word lines when an optional signal has a predetermined logic value; and accessing data to the plurality of rows of memory cells coupled to the plurality of word lines through the bit lines while the plurality of word lines are enabled.

7. The method of claim 6 wherein the plurality of rows of memory cells is m rows of memory cells where m is an integer greater than 1.

8. The method of claim 6 wherein the plurality of rows of memory cells is $2^n$ rows of memory cells where n is a positive integer.

* * * * *